(12) United States Patent
Lee et al.

(10) Patent No.: US 7,154,185 B2
(45) Date of Patent: Dec. 26, 2006

(54) ENCAPSULATION METHOD FOR SBGA

(75) Inventors: Hsin-Hui Lee, Kaohsiung (TW);
Pei-Hwa Tsao, Taichung (TW);
Chao-Yuan Su, Koahsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 117 days.

(21) Appl. No.: 10/718,191

(22) Filed: Nov. 20, 2003

(65) Prior Publication Data
US 2005/0112795 A1 May 26, 2005

(51) Int. Cl.
H01L 23/48 (2006.01)
H01L 23/52 (2006.01)
H01L 29/40 (2006.01)

(52) U.S. Cl. .................... 257/778; 257/787
(58) Field of Classification Search ........... 257/778, 257/787, 788–791, 797
See application file for complete search history.

(56) References Cited

U.S. PATENT DOCUMENTS

| | | | | |
|---|---|---|---|---|
| 6,020,218 A | 2/2000 | Shim et al. | ............... | 438/111 |
| 6,127,724 A | 10/2000 | DiStefano | ............... | 257/675 |
| 6,534,858 B1 * | 3/2003 | Akram et al. | ............... | 257/706 |
| 6,537,482 B1 | 3/2003 | Farnworth | ............... | 264/482 |
| 6,617,682 B1 | 9/2003 | Ma et al. | | |
| 2002/0056924 A1 * | 5/2002 | Chung et al. | ............... | 257/784 |

FOREIGN PATENT DOCUMENTS

| | | | |
|---|---|---|---|
| JP | 06216282 | * | 8/1994 |
| JP | 09219470 | | 8/1997 |

\* cited by examiner

*Primary Examiner*—Thanhha S. Pham
(74) *Attorney, Agent, or Firm*—Thomas, Kayden, Horstemeyer & Risley

(57) ABSTRACT

A method for encapsulating an integrated circuit chip is described. An intergrated circuit chip is attached to a substrate; a stress buffering material only covers corners of the integrated circuit chip; and an encapsulation material coats the integated circuit chip and a portion of the substrate.

14 Claims, 5 Drawing Sheets

ENCAPSULATION METHOD FOR SBGA

BACKGROUND OF THE INVENTION (1) Field of the Invention

The present invention relates to methods of packaging integrated circuit devices, and more particularly, to methods of packaging integrated circuit devices without die corner delamination.

(2) Description of the Prior Art

In the assembly of integrated circuit devices, super ball grid array (SBGA) techniques have become widely used to electrically attach component packages and to mount them on interconnection substrates such as interposer or printed circuit boards. For example, FIG. 1A shows in top view and FIG. 1B shows a cross-sectional view of a SBGA substrate 10. An integrated circuit chip 12 has been mounted on the SBGA substrate. Now, the chip 12 is to be encapsulated with a liquid resin, for example, to protect the chip. This is especially important for low dielectric constant material wafers since they are very expensive. For example, a low-k wafer has a dielectric material more brittle than fluorinated silicate glass (FSG).

A high viscosity material is applied as a dam 14. Then an encapsulation material is dispensed within the area surrounded by the dam, as shown by 16 in FIGS. 2A and 2B. The encapsulation material has a lower viscosity than the dam material. However, thermal cycling testing shows that the liquid encapsulation material 16 suffers delamination at the die corner due to shrinking of the encapsulation layer. High global stress is found at the die corner. This is caused by the mismatch between the coefficient of thermal expansion of the die and the encapsulation material.

FIG. 3 shows an enlarged view of the die 12 showing shrinking 22 of the encapsulation material 16 during curing. Layer 18 represents the active metal circuit layers. The encapsulation material peels up from the surface of the substrate as shown in 20. It is desired to find a way to prevent delamination at the die corner in order to enhance the reliability and yield of SBGA assembly.

U.S. Pat. No. 6,127,724 to DiStefano and U.S. Pat. No. 6,020,218 to Shim et al show conventional encapsulation methods. U.S. Pat. No. 6,537,482 to Farnsworth teaches encapsulating the die with a resin. The references do not teach ways of preventing delamination at the die corner.

SUMMARY OF THE INVENTION

Accordingly, it is a primary object of the invention to provide an effective and very manufacturable process of encapsulating an integrated circuit chip.

Another object of the present invention is to provide a method for encapsulating an integrated circuit chip for assembly into SBGA packaging.

Yet another object of the present invention is to provide a method for encapsulating an integrated circuit chip that prevents die corner delamination.

A further object is to provide a method for encapsulating an integrated circuit chip by applying a low coefficient of thermal expansion material to cover the die corner prior to applying the encapsulation material.

To achieve these objects of this invention, an integrated circuit chip package is provided. An integrated circuit chip is attached to a substrate; a stress buffering material only covers corners of the integrated circuit chip; and an encapsulation material coats the integrated circuit chip and a portion of the substrate.

BRIEF DESCRIPTION OF THE DRAWINGS

In the following drawings forming a material part of this description, there is shown.

DESCRIPTION OF THE PREFERRED EMBODIMENTS

The process of the present invention provides a method for encapsulating an integrated circuit chip where corner delamination is prevented. An SBGA substrate is used as an example to explain the process of the invention. It will be understood by those skilled in the art that the process of the invention will be useful with other similar substrates.

Figure 1A:
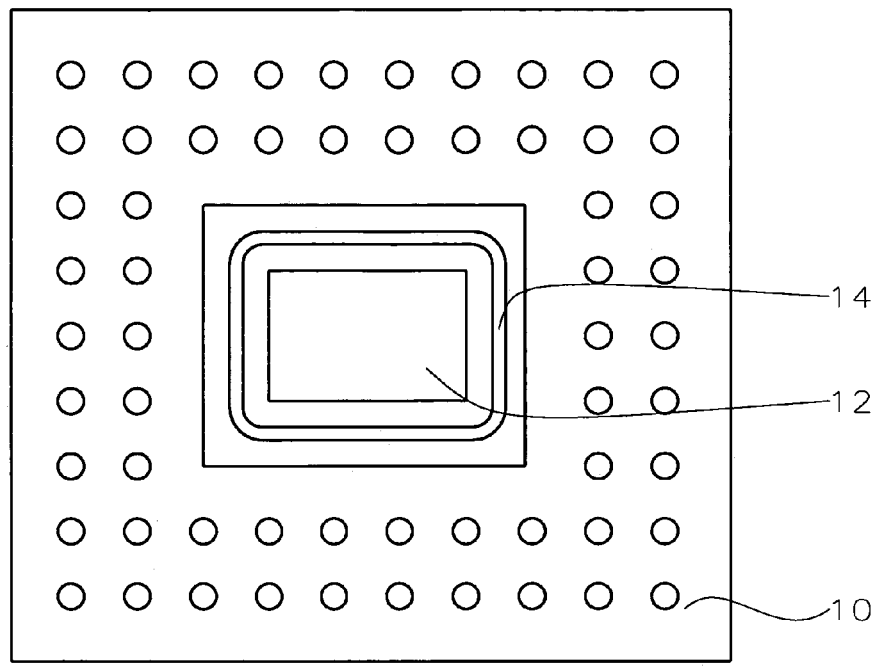
FIGS. 1A and 2A are top views of an integrated circuit chip assembly of the prior art.
Figure 1B:
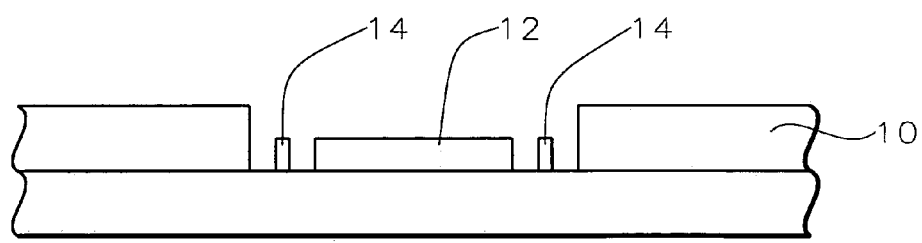
FIG. 1B is a schematic cross-sectional representation of FIG. 1A of the prior art.
Figure 2A:
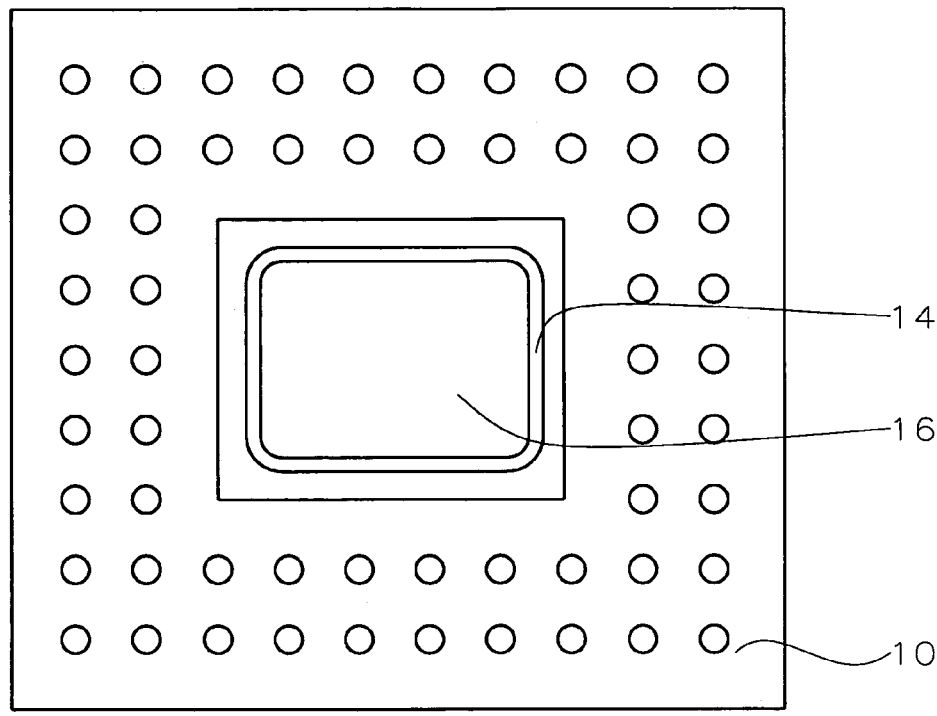
Figure 2B:
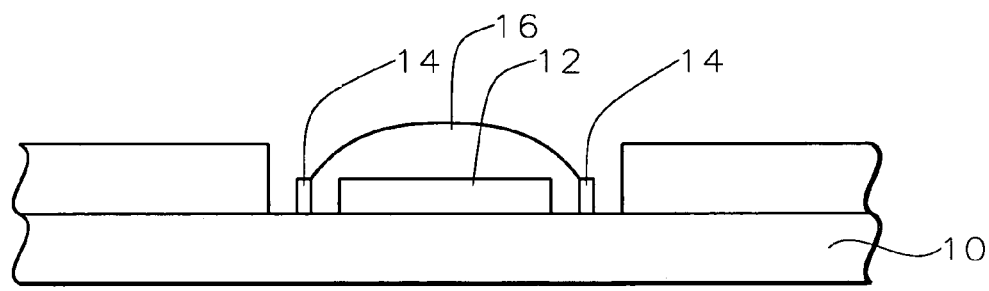
FIG. 2B is a schematic cross-sectional representation of FIG. 2A of the prior art.
Figure 3:
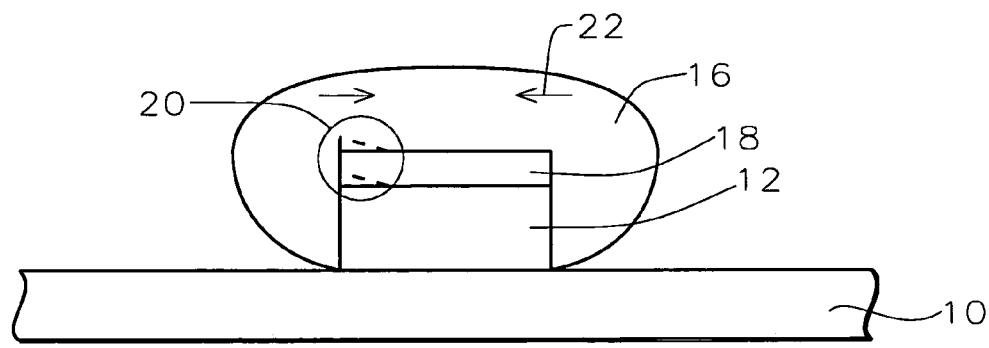
FIG. 3 is an enlarged cross-sectional representation showing delamination of the prior art.
Figure 4A:
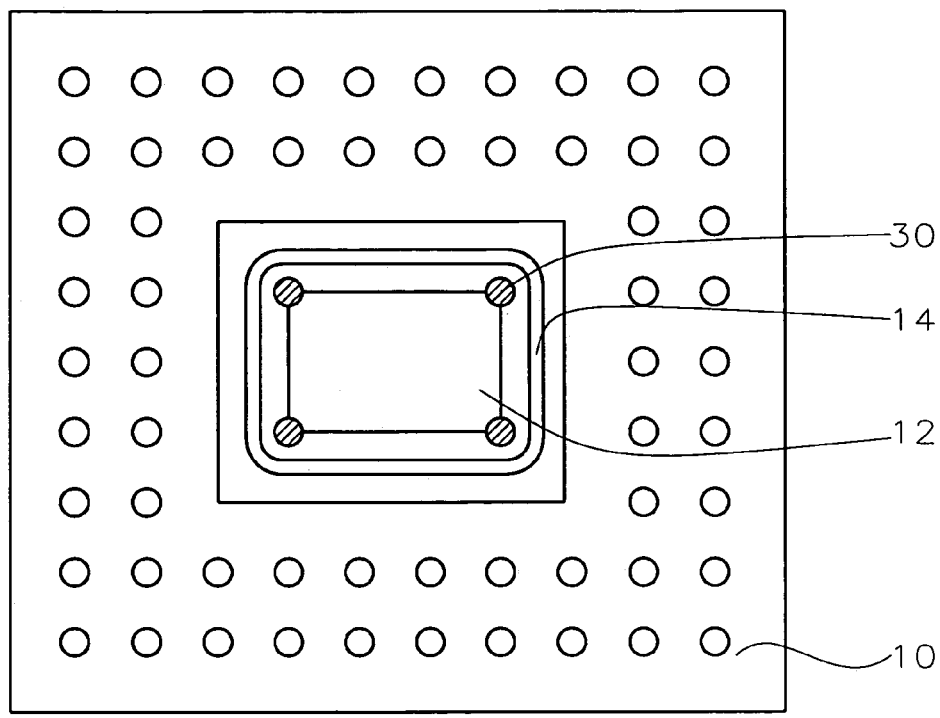
FIGS. 4A and 5A are top views of an integrated circuit chip assembly of the present invention.
Figure 4B:
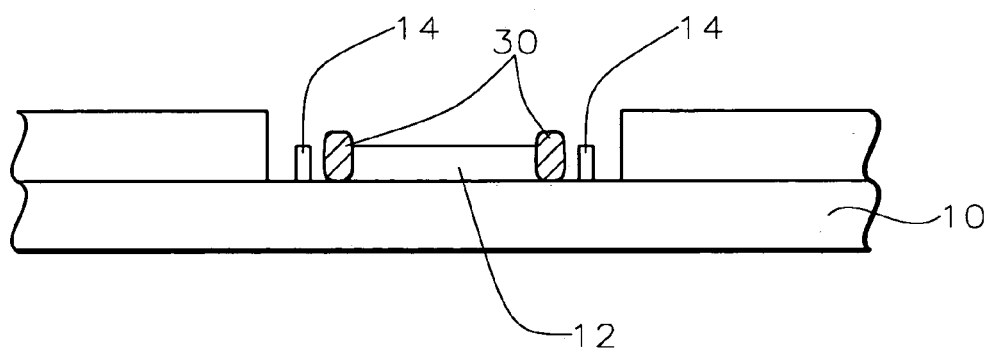
FIG. 4B is a schematic cross-sectional representation of FIG. 4A of the present invention.

Referring now more particularly to FIGS. 4A and 4B, there is shown an SBGA substrate 10. An integrated circuit chip 12 has been mounted on the SBGA substrate. A high viscosity material is applied as a dam 14. This material may be an epoxy. Now, in a key step of the present invention, a high viscosity, low coefficient of thermal expansion (CTE) material 30 is coated on the die corners of the chip 12. This material may also be epoxy or resin. There is a low CTE mismatch between the die and the material 30 because both the die and the material 30 have a similar CTE. Also, there is a small contact area between the die and the material 30. The pre-coating material 30 decreases the global stress on the die corners to a small local stress.

Figure 5A:
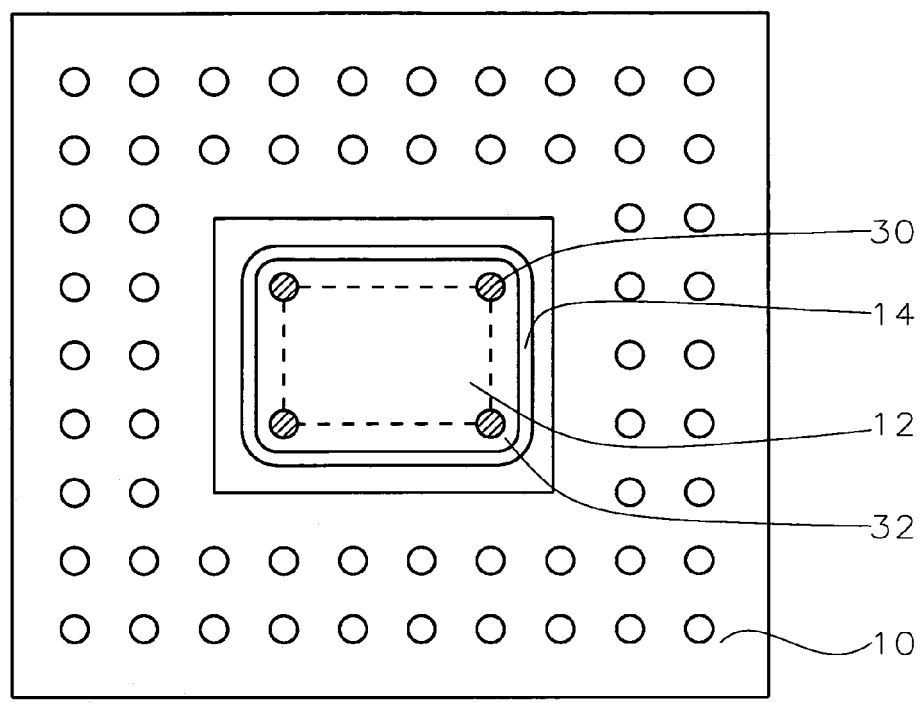
Figure 5B:
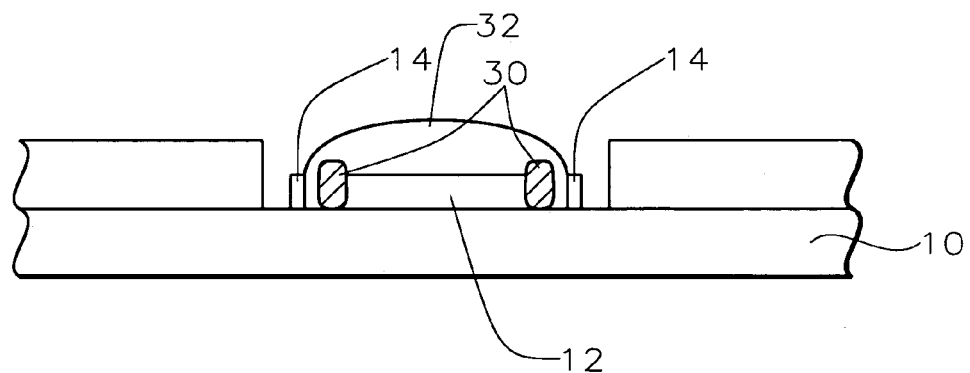
FIG. 5B is a schematic cross-sectional representation of FIG. 5A of the present invention.

Now, an encapsulation material is dispensed within the area surrounded by the dam, as shown by 32 in FIGS. 5A and 5B. This material may be an epoxy or a resin. The material 30 on the die corners acts as a stress buffer during thermal processing to prevent delamination of the encapsulation material at the die corners.

Figure 6:
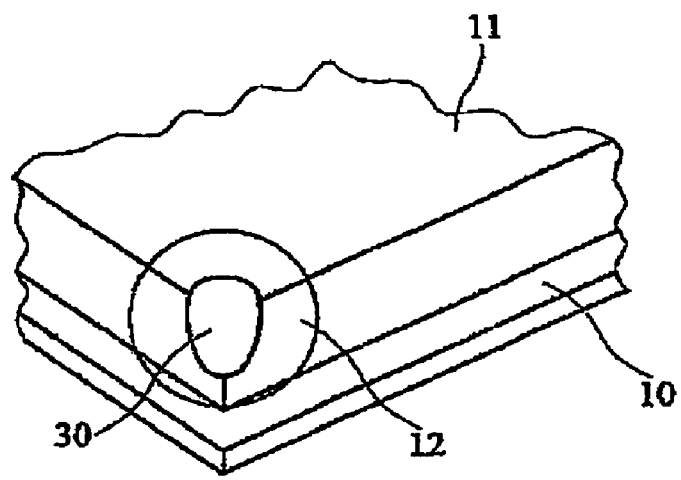
FIG. 6 is an oblique view of the die corner in the present invention.
Figure 7:
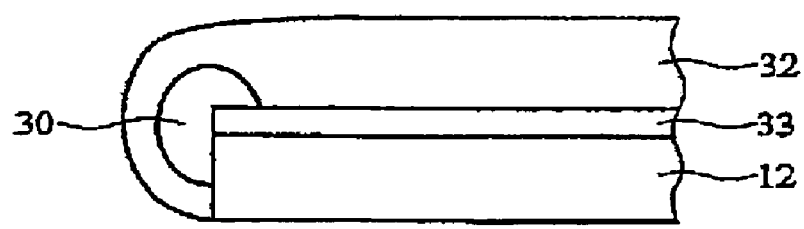
FIG. 7 is an enlarged cross-sectional representation of the present invention.

FIG. 6 shows an oblique view of the die corner. Material 30 covers the corner of the die. The die 12 has a first surface and a second surface. The second surface is attached to the substrate 10. A part of the first surface 11 is covered by the stress buffering material 30, while another part of the first surface 11 is not covered by the stress buffering material 30. FIG. 7 is an enlarged cross-sectional view of the chip 12, showing the active metal circuit layer 33. The stress buffer material layer 30 is shown covering the corner of the die. Encapsulation material 32 covers the entire die.

The process of the present invention prevents delamination of the encapsulation material at the die corners by covering the die corners with a stress buffer material prior to encapsulation.

While the invention has been particularly shown and described with reference to the preferred embodiments thereof, it will be understood by those skilled in the art that various changes in form and details may be made without departing from the spirit and scope of the invention.

What is claimed is:

1. An integrated circuit chip package comprising:
   an integrated circuit chip attached to a substrate, said integrated circuit chip having a plurality of side edges, top edges and top tips, wherein each top tip is at a position where said top edges and side edge meet;
   a stress buffering material only covering portions of said top tips of said integrated circuit chip including portions of said top edges and said side edges neighboring said top tips such that other portions of said top edges and said side edges being uncovered by said stress buffering material; and
   an encapsulation material coating said integrated circuit chip and a portion of said substrate.

2. The package according to claim 1 wherein said integrated circuit chip is attached to said substrate by a ball grid array.

3. The package according to claim 1 wherein said integrated circuit chip is attached to said substrate by a super ball grid array(SBGA) structure.

4. The package according to claim 1 wherein said encapsulation material covers said stress buffering material and wherein said stress buffering material prevents delamination of said encapsulation material at said top tips of said integrated circuit chip.

5. The package according to claim 1 wherein said stress buffering material comprises an epoxy or resin.

6. The package according to claim 1 wherein said stress buffering material has a low coefficient of thermal expansion.

7. The package according to claim 1 wherein said integrated circuit chip contains low dielectric constant dielectric layers.

8. An integrated circuit chip package comprising:
   an integrated circuit chip having a plurality of edges and tips and attached to a substrate, said integrated circuit chip having a plurality of side edges, top edges and top tips, wherein each top tip is at a position where several edges meet;
   a stress buffering material having a substantially equal coefficient of thermal expansion to said integrated circuit chip, said stress buffering material only covering portions of said top tips of said integrated circuit chip including portions of said top edges and said side edges neighboring said top tips such that other portions of said top edges and said side edges being uncovered by said stress buffering material; and
   an encapsulation material covering said integrated circuit chip and said stress buffering material.

9. The package according to claim 8 wherein said encapsulation material covers said stress buffering material and wherein said stress buffering material prevents delamination of said encapsulation material at said top tips of said integrated circuit chip.

10. The package according to claim 8 wherein said stress buffering material comprises an epoxy or resin.

11. The package according to claim 8 wherein said stress buffering material has a low coefficient of thermal expansion.

12. The package according to claim 8 wherein said integrated circuit chip contains low dielectric constant dielectric layers.

13. The package according to claim 8 wherein said integrated circuit chip is attached to said substrate by a ball grid array.

14. The package according to claim 8 wherein said integrated circuit chip is attached to said substrate by a super ball grid array (SBGA) structure.

* * * * *